(12) United States Patent
Kim et al.

(10) Patent No.: US 9,036,103 B2
(45) Date of Patent: May 19, 2015

(54) DISPLAY SUBSTRATE, METHOD OF MANUFACTURING THE SAME AND DISPLAY APPARATUS HAVING THE SAME

(75) Inventors: Swae-Hyun Kim, Asan-si (KR); Hoon Kang, Seoul (KR); Jae-Hwa Park, Gumi-si (KR); Yeo-Geon Yoon, Seoul (KR); Sung-Hee Hong, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 261 days.

(21) Appl. No.: 13/563,966

(22) Filed: Aug. 1, 2012

(65) Prior Publication Data
US 2013/0169901 A1 Jul. 4, 2013

(30) Foreign Application Priority Data
Jan. 4, 2012 (KR) .................. 10-2012-0000793

(51) Int. Cl.
| | | |
|---|---|---|
| *G02F 1/136* | (2006.01) | |
| *G02F 1/1335* | (2006.01) | |
| *G02F 1/1343* | (2006.01) | |
| *G02F 1/1333* | (2006.01) | |
| *G02F 1/1339* | (2006.01) | |
| *H01L 29/786* | (2006.01) | |
| *H01L 27/12* | (2006.01) | |
| *G02F 1/1362* | (2006.01) | |

(52) U.S. Cl.
CPC ...... *G02F 1/13394* (2013.01); *H01L 29/78633* (2013.01); *H01L 27/1248* (2013.01); *G02F 1/136209* (2013.01); *G02F 1/136227* (2013.01); *G02F 2001/136222* (2013.01)

(58) Field of Classification Search
CPC .......... G02F 1/13394; G02F 1/133512; G02F 1/136209; G02F 2001/136222
USPC .................................... 349/43, 106, 110, 155
See application file for complete search history.

(56) References Cited

U.S. PATENT DOCUMENTS

| | | | | |
|---|---|---|---|---|
| 7,312,840 | B1 * | 12/2007 | Sakamoto | 349/106 |
| 2009/0303423 | A1 * | 12/2009 | Kim et al. | 349/110 |
| 2010/0019246 | A1 * | 1/2010 | Kim et al. | 257/72 |
| 2011/0090445 | A1 * | 4/2011 | Kim et al. | 349/139 |
| 2012/0212701 | A1 * | 8/2012 | Hwang et al. | 349/155 |

FOREIGN PATENT DOCUMENTS

| | | |
|---|---|---|
| KR | 1020060125137 A | 12/2006 |
| KR | 1020060132167 A | 12/2006 |
| KR | 1020070093752 A | 9/2007 |
| KR | 1020090025643 A | 3/2009 |

* cited by examiner

*Primary Examiner* — Huyen Ngo
(74) *Attorney, Agent, or Firm* — Cantor Colburn LLP

(57) ABSTRACT

A display substrate includes a base substrate, a thin-film transistor (TFT), a color filter and a pixel electrode. The TFT is on the base substrate. The color filter is on the base substrate including the TFT and in contact with the base substrate. The pixel electrode is on the color filter and in electrical connection to a drain electrode of the TFT.

15 Claims, 9 Drawing Sheets

DISPLAY SUBSTRATE, METHOD OF MANUFACTURING THE SAME AND DISPLAY APPARATUS HAVING THE SAME

This application claims priority to Korean Patent Application No. 10-2012-0000793, filed on Jan. 4, 2012, and all the benefits accruing therefrom under 35 U.S.C. §119, the contents of which are herein incorporated by reference in its entireties.

BACKGROUND OF THE INVENTION

1. Field of the Invention

Exemplary embodiments of the invention relate to a display substrate, a method of manufacturing the display substrate and a display apparatus including the display substrate. More particularly, exemplary embodiments of the invention relate to a display substrate including a color filter, a method of manufacturing the display substrate and a display apparatus including the display substrate.

2. Description of the Related Art

A display apparatus includes a base substrate and a thin-film transistor ("TFT") on the base substrate.

The base substrate includes glass and a refractive index of the base substrate is about 1.4 to about 1.6.

The TFT includes a gate electrode on the base substrate and extended from a gate line, a gate insulating layer on the gate electrode, an active layer on the gate insulating layer, an ohmic-contact layer including separate portions on the active layer, and a source electrode and a drain electrode on the ohmic-contact layer and spaced apart from each other.

The gate insulating layer covers the base substrate in a region of the base substrate excluding the gate electrode. Thus, the gate insulating layer directly contacts the base substrate in the region excluding the gate electrode. The gate insulating layer includes silicon nitride and a refractive index of the gate insulating layer is about 1.7 to about 2.1. Thus, the refractive index of the gate insulating layer and the refractive index of the base substrate are different from each other.

The base substrate and the gate insulating layer of which the refractive indexes are different from each other are contact with each other, and thus a light is reflected at an interface between the base substrate and the gate insulating layer. Therefore, transmittance rate of the display apparatus may be decreased, and thus a quality of an image displayed on the display apparatus may be decreased.

BRIEF SUMMARY OF THE INVENTION

One or more exemplary embodiments of the invention provide a display substrate having improved image quality.

One or more exemplary embodiments of the invention also provide a method of manufacturing the above-mentioned display substrate.

One or more exemplary embodiments of the invention also provide a display apparatus having the above-mentioned display substrate.

According to an exemplary embodiment of the invention, a display substrate includes a base substrate, a thin-film transistor (TFT), a color filter and a pixel electrode. The TFT is on the base substrate. The color filter is on the base substrate including the TFT thereon and is in contact with the base substrate. The pixel electrode is on the color filter and in electrical connection with a drain electrode of the TFT.

In one embodiment, the display substrate may include a light blocking portion between the TFT and the color filter, where the light blocking portion overlaps the TFT.

In one embodiment, the color filter may be in contact with the base substrate in a region of the base substrate which excludes the light blocking portion.

In one embodiment, the TFT may include a gate electrode which is extended from a gate line, and a gate insulating layer on the gate electrode. A length of the gate insulating layer may be substantially the same as a length of the light blocking portion in a first direction in which the gate line is extended.

In one embodiment, the display substrate may include a passivation layer between the TFT and the light blocking portion, where the passivation layer overlaps the TFT. A length of the passivation layer may be substantially the same as a length of the light blocking portion in a first direction in which a gate line is extended.

In one embodiment, the display substrate may include a contact hole which extends through thicknesses of the color filter and the light blocking portion. The pixel electrode and the drain electrode of the TFT may be electrically connected to each other through the contact hole.

In one embodiment, the display substrate may include a column spacer on the contact hole.

In one embodiment, the column spacer may have an achromatic color.

In one embodiment, the display substrate may include a capping layer which overlaps the color filter and protects the color filter.

In one embodiment, a refractive index of the base substrate and a refractive index of the color filter may be substantially the same.

According to another exemplary embodiment of the invention, there is a provided a method of manufacturing a display substrate. In the method, a TFT is formed on a base substrate. A color filter is formed on the TFT formed on the base substrate. The color filter is in contact with the base substrate. The pixel electrode is formed on the color filter. The pixel electrode is electrically connected to a drain electrode of the TFT.

In one embodiment, a light blocking portion may be further formed on the TFT to overlap the TFT.

In one embodiment, the TFT may be formed by forming a gate electrode which is extended from a gate line and forming a gate insulating layer on the gate electrode.

In one embodiment, the gate insulating layer may be further etched using the light blocking portion as a mask.

In one embodiment, a passivation layer may be further formed between the TFT and the light blocking portion, where the passivation layer overlaps the TFT.

In one embodiment, the passivation layer may be further etched using the light blocking portion as a mask.

In one embodiment, a contact hole may be further formed to extend through the color filter and the light blocking portion. The pixel electrode is electrically connected to the drain electrode of the TFT through the contact hole.

In one embodiment, a column spacer may be formed on the contact hole.

In one embodiment, a capping layer may be further formed on the color filter. The capping layer covers the color filter and protects the color filter.

According to still another exemplary embodiment of the invention, a display apparatus includes a display substrate, an opposite substrate and a liquid crystal layer. The display substrate includes a first base substrate, a TFT on the first base substrate, a color filter on the first base substrate including the TFT and in contact with the first base substrate, and a pixel electrode on the color filter and in electrical connection with a drain electrode of the TFT. The opposite substrate includes a second base substrate which faces the first base substrate, and a common electrode on the second base substrate. The liquid crystal layer is between the display substrate and the opposite substrate.

According to one or more exemplary embodiments of the invention, a base substrate and a color filter of which refractive indexes are the same, are in contact with each other in a region of the base substrate which is not blocked or overlapped by a TFT, and thus a reflection of light at an interface between the base substrate and the color filter may be decreased. Thus, a transmittance rate of the display apparatus may be increased and a quality of an image displayed on the display apparatus may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
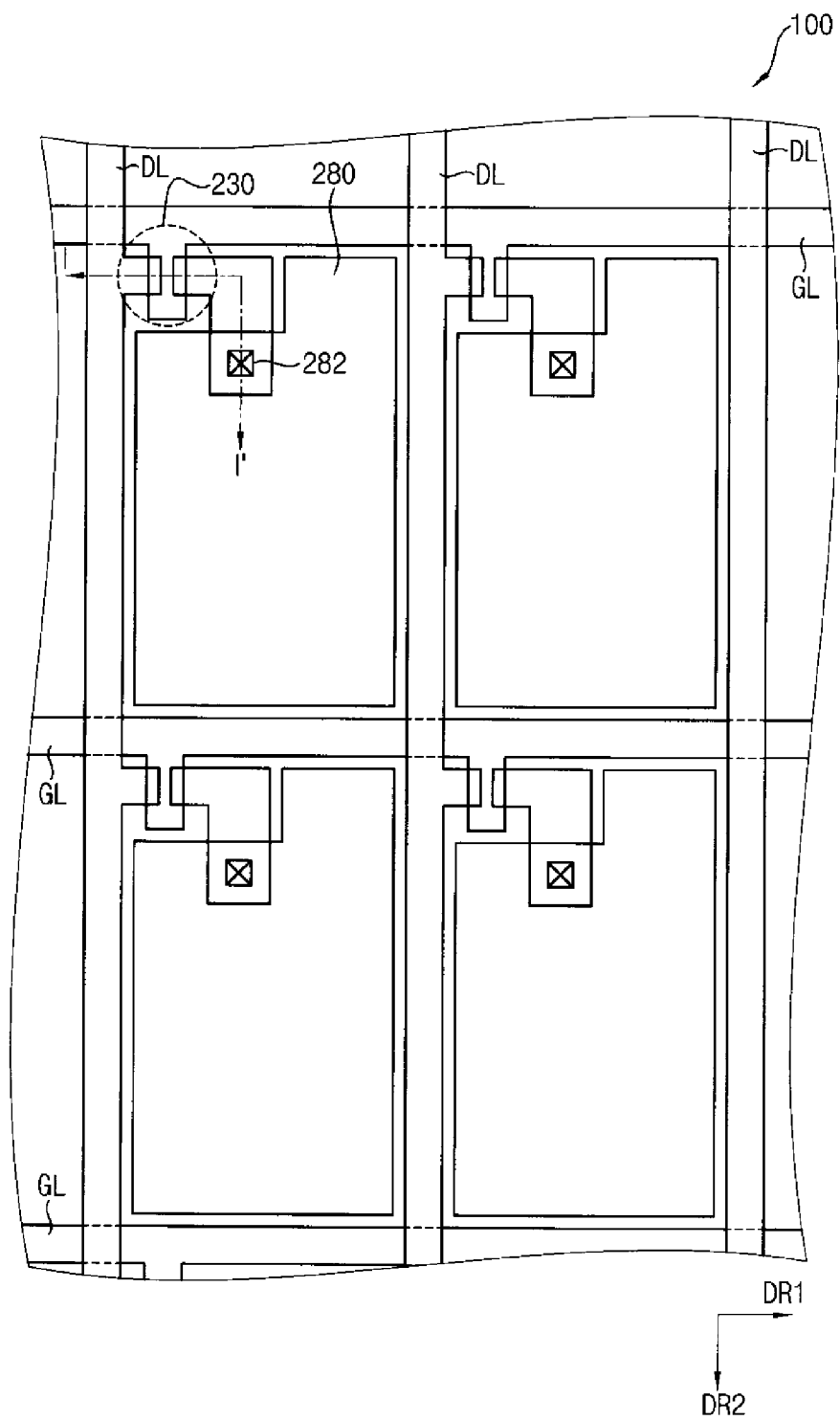
FIG. 1 is a plan view illustrating an exemplary embodiment of a display substrate according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 2:
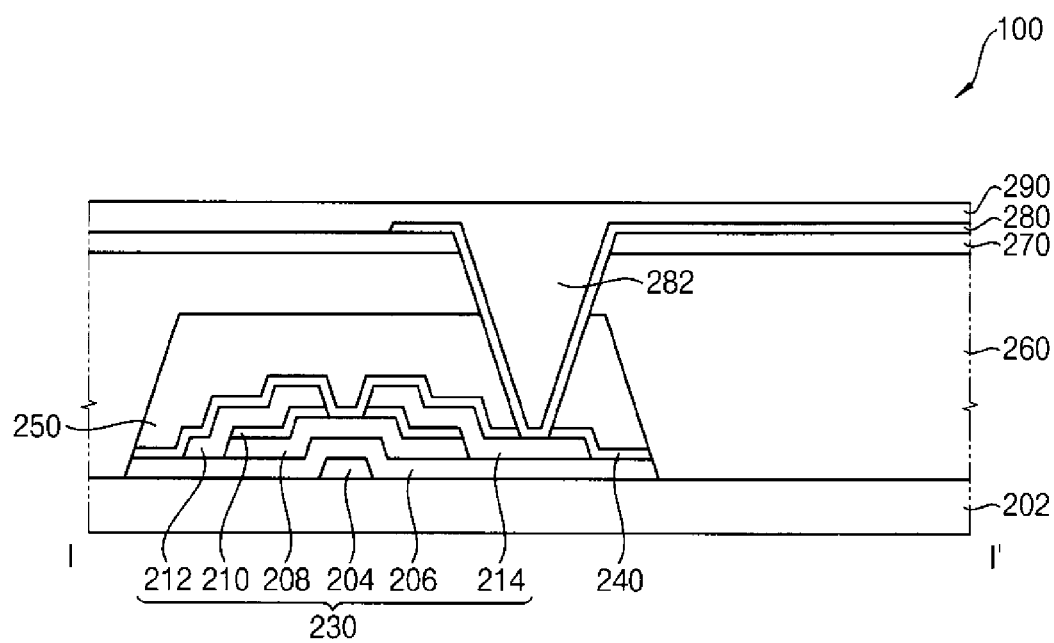
FIG. 2 is a cross-sectional view taken along line I-I' of FIG. 1.

FIG. 1 is a plan view illustrating an exemplary embodiment of a display substrate according to the invention, and FIG. 2 is a cross-sectional view taken along line I-I' of FIG. 1.

Referring to FIGS. 1 and 2, the exemplary embodiment of display substrate 100 includes a base substrate 202, a gate line GL, a data line DL, a thin-film transistor ("TFT") 230, a light blocking portion 250, a color filter 260 and a pixel electrode 280. The display substrate 100 may include a plurality of gate lines GL, a plurality of data lines DL, a plurality of light blocking portions 250, a plurality of color filters 260 and/or a plurality of pixel electrodes 280.

The base substrate 202 may include glass, plastic, etc. In one exemplary embodiment, for example, a refractive index of the base substrate 202 may be about 1.4 to about 1.6.

The gate lines GL and the data lines DL are on the base substrate 202. The gate lines GL each include a longitudinal axis which extends in a first direction DR1, and the gate lines GL are spaced apart from each other in a second direction DR2 substantially perpendicular to the first direction DR1. The data lines DL each include a longitudinal axis which extends in the second direction DR2, and the data lines DL are spaced apart from each other in the first direction DR1.

The TFT 230 is on the base substrate 202 and is electrically connected to the gate line GL and the data line DL.

In one exemplary embodiment, for example, the TFT 230 may include a gate electrode 204 extended from the gate line GL, a gate insulating layer 206 directly on the gate electrode 204 and a portion of the base substrate 202, an active layer 208 on the gate insulating layer 206, an ohmic-contact layer 210 including separated portions on the active layer 208, a source electrode 212 on the ohmic-contact layer 210 and extended from the data line DL, and a drain electrode 214 on the ohmic-contact layer 210 and spaced apart from the source electrode 212.

The gate insulating layer 206 covers and overlaps all exposed surfaces of the gate electrode 204 to insulate the gate electrode 204 from the active layer 208. In addition, the gate insulating layer 206 is not on portions of the base substrate 202 which are not blocked or overlapped by the TFT 230. In one exemplary embodiment, for example, the gate insulating layer 206 may include silicon nitride or silicon oxide, and a refractive index of the gate insulating layer 206 may be about 1.7 to about 2.1.

A passivation layer 240 may be further on the TFT 230. The passivation layer 240 covers the TFT 230 to protect the TFT 230. In addition, the passivation layer 240 is not on the portions of the base substrate 202 which are not blocked or overlapped by the TFT 230. In one exemplary embodiment, for example, the passivation layer 240 may include silicon nitride or silicon oxide, and a refractive index of the passivation layer 240 may be about 1.7 to about 2.1.

The light blocking portion 250 is on the passivation layer 240 which is on the TFT 230. In one exemplary embodiment, for example, the light blocking portion 250 may be a black matrix. The light blocking portion 250 covers the TFT 230 to prevent the TFT 230 from being damaged by an external light. In addition, the light blocking portion 250 is not on the portions of the base substrate 202 which are not blocked or overlapped by the TFT 230.

Thus, a length of the gate insulating layer 206, a length of the passivation layer 240 and a length of the light blocking portion 250 in the first direction DR1 may be substantially the same. Edges of the gate insulating layer 206, edges of the passivation layer 240 and edges of the light blocking portion 250 may be substantially aligned.

The color filter 260 is on the light blocking portion 250 which overlaps both the base substrate 202 and the TFT 230. Thus, the color filter 260 covers the TFT 230 and the light blocking portion 250. In addition, the color filter 260 makes contact with the portions of the base substrate 202 which are not blocked by the TFT 230. Thus, the color filter 260 makes contact with the base substrate 202 in a region of the base substrate 202 which excludes the light blocking portion 250. The color filter 260 may be one of a red color filter, a green color filter and a blue color filter. In one exemplary embodiment, for example, a refractive index of the color filter 260 may be about 1.4 to about 1.6, and the refractive index of the color filter 260 may be substantially the same as the refractive index of the base substrate 202.

The pixel electrode 280 is on the color filter 260. The pixel electrode 280 is electrically connected to the drain electrode 214 of the TFT 230 through a contact hole 282 extending completely through the passivation layer 240, the light blocking portion 250, the color filter 260 and a capping layer 270 (described below). The pixel electrode 280 may include indium tin oxide ("ITO") or indium zinc oxide ("IZO").

The light blocking portion 250 of which the refractive index is comparatively high is between the TFT 230 and the pixel electrode 280. Therefore, a capacitance between the TFT 230 and the pixel electrode 280 may be increased, and thus resistive-capacitive ("RC") delay of a data transmission may occur. In this case, a width of the data line DL, a width of the source electrode 212 and a width of the drain electrode 214 may be increased so as to increase the 'R' value corresponding to a resistance. The widths may be taken perpendicular to a respective longitudinal axis of the data line DL, the source electrode 212 and the drain electrode 214.

The capping layer 270 may be further between the color filter 260 and the pixel electrode 280. The capping layer 270 covers the color filter 260 to protect the color filter 260 and prevent the color filter 260 from being loosened with respect to other elements in the display substrate 100. In addition, the capping layer 270 may planarize an upper surface of the color filter 260. In one exemplary embodiment, for example, the capping layer 270 may include silicon nitride or silicon oxide, and a refractive index of the capping layer 270 may be about 1.7 to about 2.1.

The display apparatus 100 may further include an alignment layer 290 on the pixel electrode 280. The alignment layer 290 aligns a liquid crystal disposed on the display substrate 100.

FIGS. 3A to 3G are cross-sectional views illustrating an exemplary embodiment of a method of manufacturing the display substrate 100 in FIGS. 1 and 2.

Figure 3A:
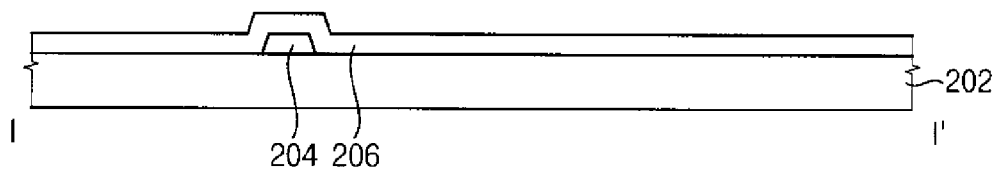
FIGS. 3A to 3G are cross-sectional views illustrating an exemplary embodiment of a method of manufacturing the display substrate in FIGS. 1 and 2.

Referring to FIG. 3A, the gate electrode 204 is formed directly on the base substrate 202, and the gate insulating layer 206 is formed directly on the gate electrode 204. The gate insulating layer 206 may cover portions of the base substrate 202 which are not blocked or overlapped by the gate electrode 204.

Figure 3B:
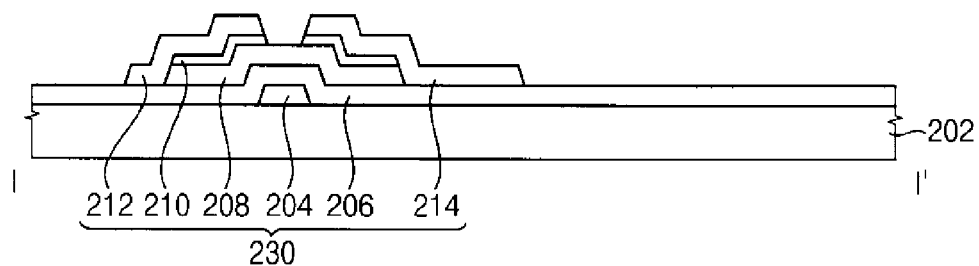

Referring to FIG. 3B, the active layer 208 is formed directly on the gate insulating layer 206, the ohmic-contact layer 210 including separated portions is formed directly on the active layer 208, and the source electrode 212 and the drain electrode 214 are formed directly on the ohmic-contact layer 210, to form the TFT 230.

Figure 3C:
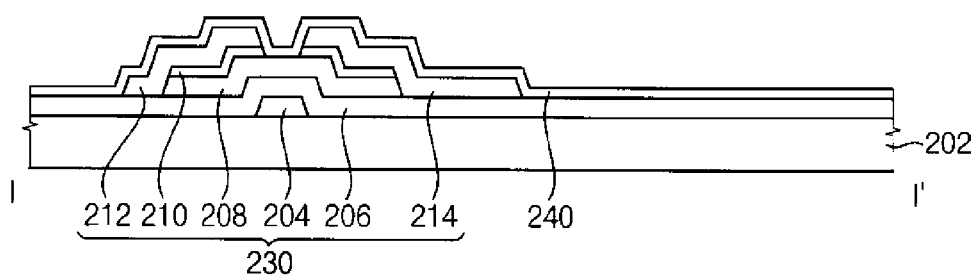

Referring to FIG. 3C, the passivation layer 240 is formed directly on the TFT 230 and the gate insulating layer 206. The passivation layer 240 may cover portions of the gate insulating layer 206 which are not blocked or overlapped by the TFT 230.

Figure 3D:
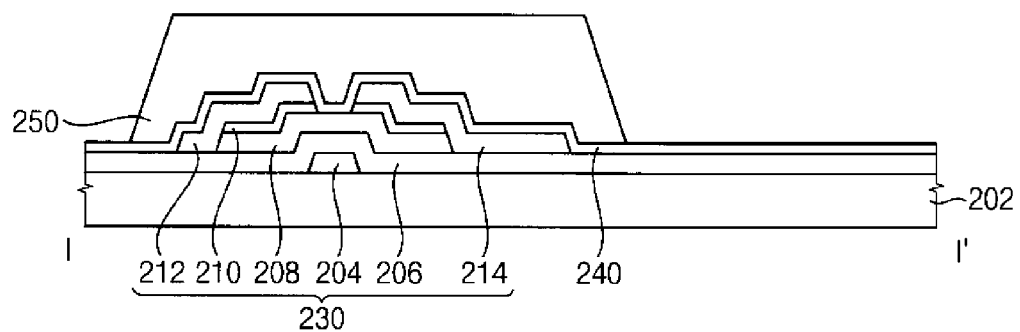

Referring to FIG. 3D, the light blocking portion 250 is formed directly on the passivation layer 240 which is on the TFT 230. The light blocking portion 250 covers the TFT 230 and the light blocking portion 250 is not formed on the portions of the base substrate 202 which are not blocked or overlapped by the TFT 230.

Figure 3E:
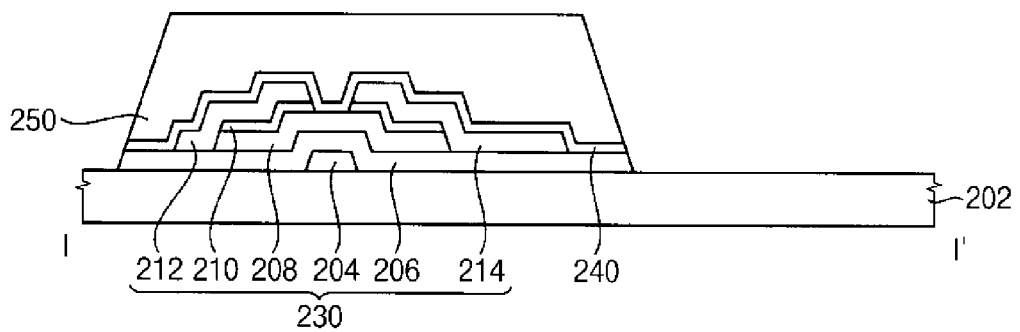

Referring to FIG. 3E, portions of the passivation layer 240 and the gate insulating layer 206 not overlapped by the light blocking portion 250 are etched using the light blocking portion 250 as a mask. Thus, the portions of the base substrate 202 which are not blocked or overlapped by the TFT 230 and the light blocking portion 250 are exposed.

In a process of etching the passivation layer 240 and the gate insulating layer 206 using the light blocking portion 250 as the mask, a height and a width of the light blocking portion 250 may be decreased. The height is taken perpendicular to the base substrate 202, and the width may be taken in the first and/or second directions DR1 and DR2. Thus, in a process of forming the light blocking portion 250, original dimensions and/or quantity of the light blocking portion 250 may be formed considering the decrease in the dimensions and/or quantity of the light blocking portion 250 from the process of etching the passivation layer 240 and the gate insulating layer 206.

Figure 3F:
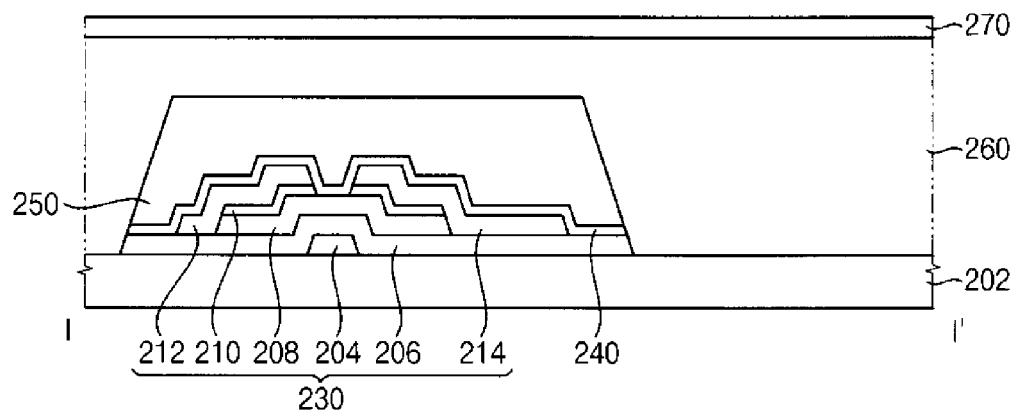

Referring to FIG. 3F, the color filter 260 is formed directly on the base substrate 202, the TFT 230 and the light blocking portion 250. Thus, the color filter 260 covers all exposed surfaces of the TFT 230 and the light blocking portion 250. In addition, the color filter 260 makes contact with the portions of the base substrate 202 which are not blocked or overlapped by the TFT 230 and the light blocking portion 250.

The capping layer 270 may be formed directly on the color filter 260.

Figure 3G:
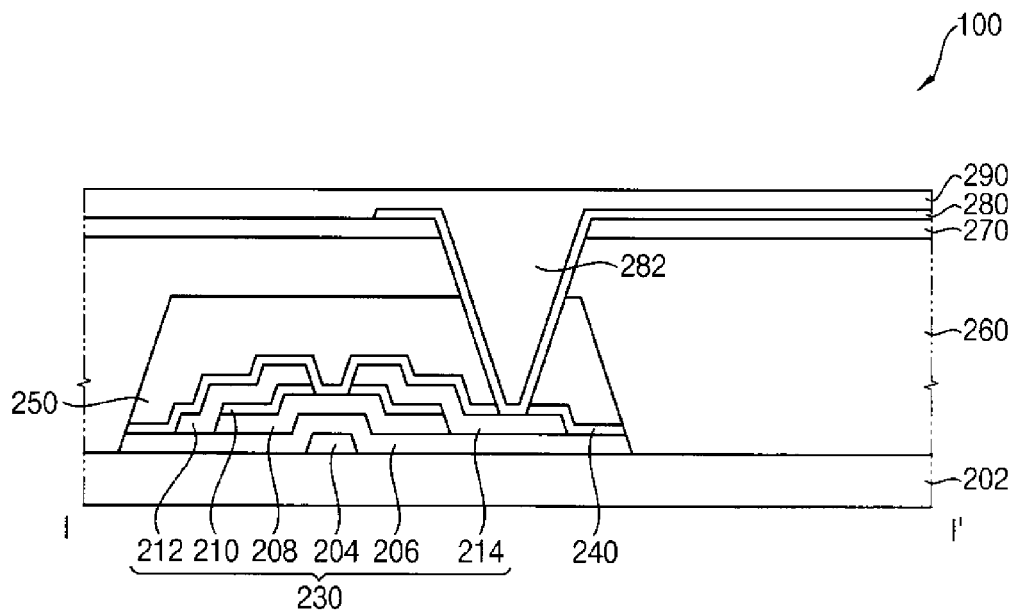

Referring to FIG. 3G, the contact hole 282 is formed to extend completely through thicknesses of the passivation layer 240, the light blocking portion 250, the color filter 260 and the capping layer 270, and the pixel electrode 280 is formed directly on the capping layer 270. The pixel electrode 280 is electrically connected to the drain electrode 214 of the TFT 230 through the contact hole 282.

The alignment layer 290 is formed directly on the pixel electrode 280, to essentially complete the display substrate 100.

In the exemplary embodiment, the contact hole 282 is formed extending completely through thicknesses of the passivation layer 240, the light blocking portion 250, the color filter 260 and the capping layer 270, after the passivation layer 240, the light blocking portion 250, the color filter 260 and the capping layer 270 are formed, but the invention is not limited thereto. In an alternative exemplary embodiment, for example, a first contact hole may be formed extending through the passivation layer 240 and the light blocking portion 250 after the passivation layer 240 and the light blocking portion 250 are formed, and a second contact hole may be formed extending through the color filter 260 and the capping layer 270 after the color filter 260 and the capping layer 270 are formed. The first and second contact holes may be aligned with each other such that pixel electrode 280 can be electrically connected to the drain electrode 214 of the TFT 230 through the aligned first and second contact holes.

Figure 4:
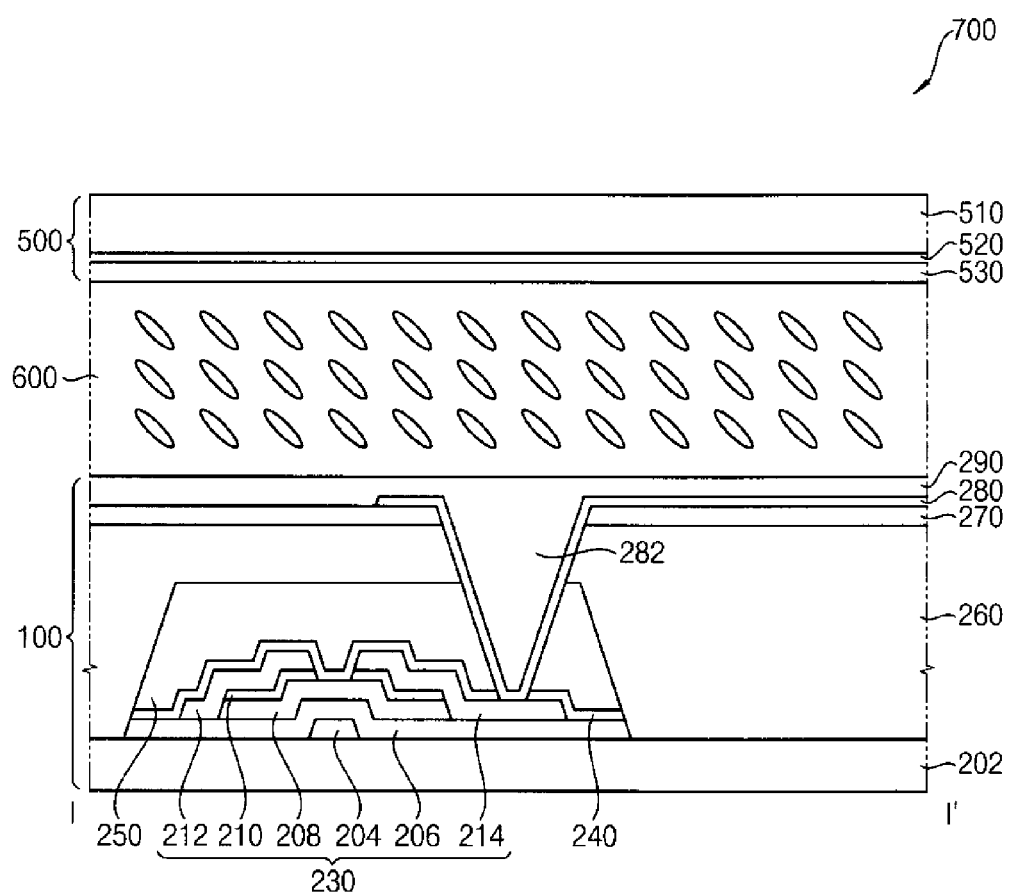
FIG. 4 is a cross-sectional view illustrating an exemplary embodiment of a display apparatus including the display substrate of FIGS. 1 and 2.

FIG. 4 is a cross-sectional view illustrating an exemplary embodiment of a display apparatus including the display substrate 100 of FIGS. 1 and 2.

Referring to FIG. 4, the display apparatus 700 includes the display substrate 100, an opposite substrate 500 and a liquid crystal layer 600.

The display substrate 100 includes the base substrate 202, the TFT 230, the passivation layer 240, the light blocking portion 250, the color filter 260, the pixel electrode 280 and the alignment layer 290.

The opposite substrate 500 includes a base substrate 510, a common electrode 520 and an alignment layer 530.

The base substrate 510 faces the base substrate 202. The base substrate 510 may include glass, plastic, etc.

The common electrode 520 is on the base substrate 510. The common electrode 520 may include ITO or IZO.

The liquid crystal layer 600 is interposed between the display substrate 100 and the opposite substrate 500, and the liquid crystal layer 600 includes a liquid crystal aligned by an electric field formed between the pixel electrode 280 and the common electrode 520.

According to the exemplary embodiment, the gate insulating layer 206 of which the refractive index is different from the refractive index of the base substrate 202, is not on portions of the base substrate 202 which are not blocked or overlapped by the TFT 230 and the light blocking portion 250. Additionally, the base substrate 202 and the color filter 260 of which the refractive indexes are the same, contact with each other. Therefore, a reflection of light at an interface between the base substrate 202 and the color filter 260 may be decreased, and thus a transmittance rate of the display substrate 100 may be increased.

In addition, the light blocking portion 250 and the color filter 260 are included in the display substrate 100, and thus the opposite substrate 500 may be simplified.

Figure 5:
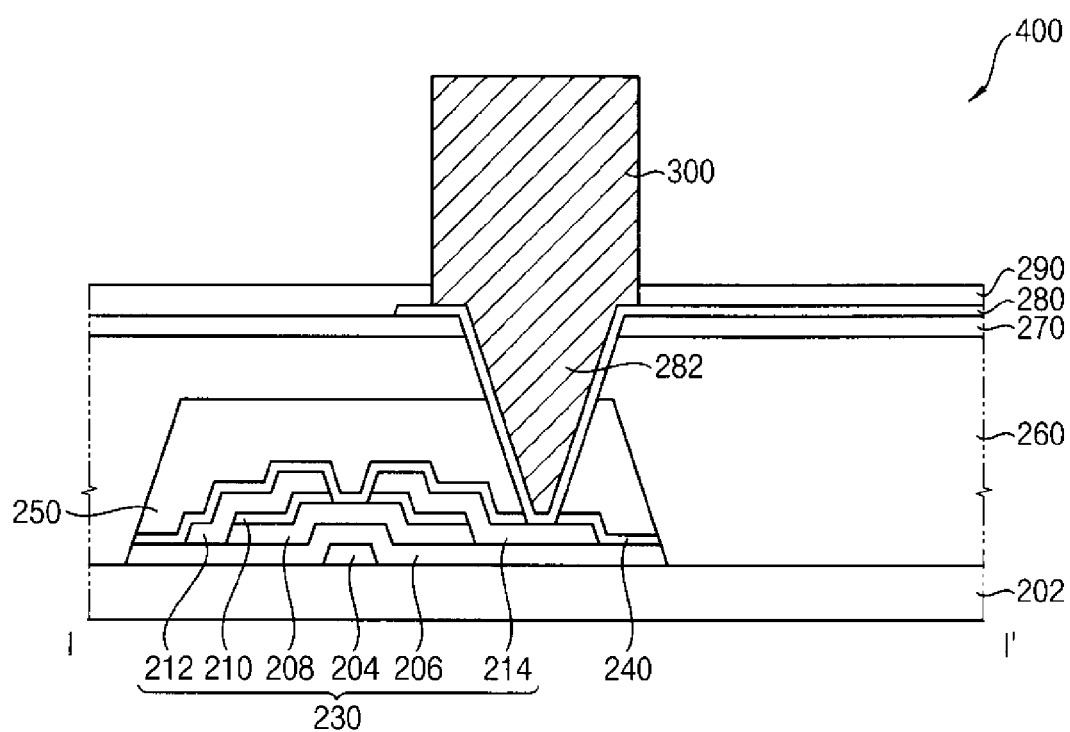
FIG. 5 is a cross-sectional view illustrating another exemplary embodiment of a display substrate according to the invention.

FIG. 5 is a cross-sectional view illustrating another exemplary embodiment of a display substrate according to the invention.

The exemplary embodiment of display substrate 400 in FIG. 5 is substantially the same as the previous exemplary embodiment of the display substrate 100 in FIGS. 1 and 2 except for a column spacer 300. Thus, the same reference numerals will be used to refer to same or like parts as those described in the previous exemplary embodiment and any further repetitive explanation concerning the above elements will be omitted.

Referring to FIG. 5, the exemplary embodiment of the display substrate 400 includes the base substrate 202, the TFT 230, the passivation layer 240, the light blocking portion 250, the color filter 260, the pixel electrode 280, the alignment layer 290 and the column spacer 300.

The pixel electrode 280 is electrically connected to the drain electrode 214 of the TFT 230 through the contact hole 282 extending through the passivation layer 240, the light blocking portion 250, the color filter 260 and the capping layer 270.

The column spacer 300 is on the contact hole 282 and may completely fill an entire of the contact hole 282. The column spacer 300 has an achromatic color to absorb an external light incident into the display substrate 400. An unintended white point or white line may occur due to a reflection of the external light by the pixel electrode 280 in the contact hole 282. Thus, the column spacer 300 may reduce or effectively prevent display of the unintended white point or white line on a display apparatus.

Figure 6:
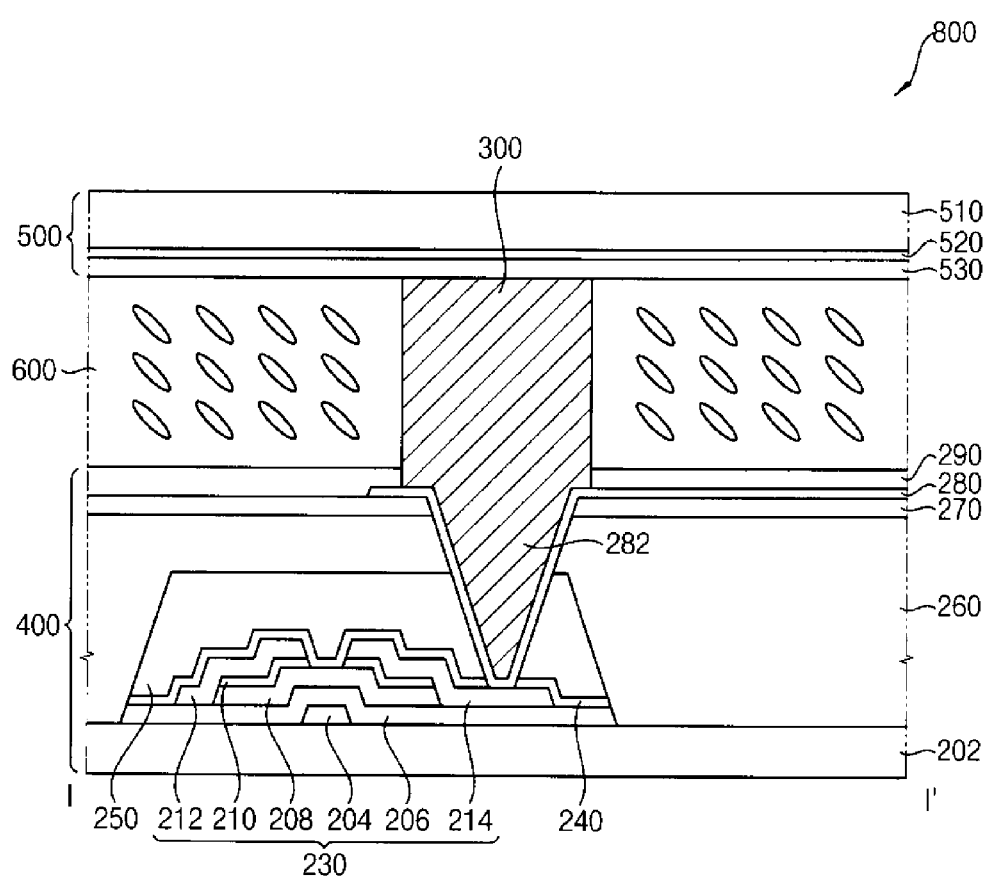
FIG. 6 is a cross-sectional view illustrating an exemplary embodiment of a display apparatus including the display substrate of FIG. 5.

FIG. 6 is a cross-sectional view illustrating an exemplary embodiment of a display apparatus including the display substrate 400 of FIG. 5.

The exemplary embodiment of display apparatus 800 in FIG. 6 is substantially the same as the previous exemplary embodiment of the display apparatus 700 in FIG. 4 except for the column spacer 300. Thus, the same reference numerals will be used to refer to same or like parts as those described in the previous exemplary embodiment and any further repetitive explanation concerning the above elements will be omitted.

Referring to FIG. 6, the display apparatus 800 includes the display substrate 400, the opposite substrate 500 and the liquid crystal layer 600.

The column spacer 300 is on the contact hole 282 and has the achromatic color to absorb the external light incident into the display substrate 400. In addition, the column spacer 300 supports the display substrate 400 and the opposite substrate 500 to maintain a distance between the display substrate 400 and the opposite substrate 500, e.g., a cell gap.

According to the exemplary embodiment, the column spacer 300 having the achromatic color is on the contact hole 282 so that the column spacer 300 absorbs the external light incident into the display substrate 400, and thus a decrease of an image quality due to the reflection of the external light by the pixel electrode 280 also in the contact hole 282, may be reduced or effectively prevented.

In addition, the column spacer 300 supports the display substrate 400 and the opposite substrate 500 to maintain the distance between the display substrate 400 and the opposite substrate 500, and thus the cell gap may be constantly maintained.

Figure 7:
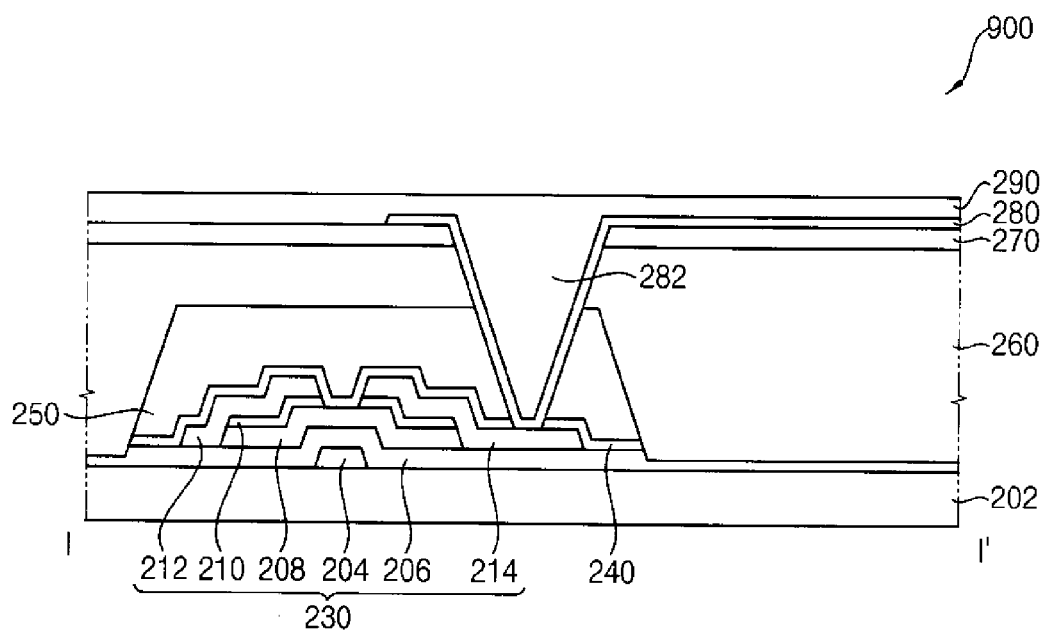
FIG. 7 is a cross-sectional view illustrating still another exemplary embodiment of a display substrate according to the invention.

FIG. 7 is a cross-sectional view illustrating still another exemplary embodiment of a display substrate according to the invention.

The exemplary embodiment of display substrate 900 in FIG. 7 is substantially the same as the previous exemplary embodiment of the display substrate 100 in FIGS. 1 and 2 except for the gate insulating layer 206. Thus, the same reference numerals will be used to refer to same or like parts as those described in the previous exemplary embodiment and any further repetitive explanation concerning the above elements will be omitted.

Referring to FIG. 7, the exemplary embodiment of the display substrate 900 includes the base substrate 202, the TFT 230, the passivation layer 240, the light blocking portion 250, the color filter 260, the capping layer 270, the pixel electrode 280 and the alignment layer 290.

A thickness of the gate insulating layer 206 in a region of the base substrate 202 which is not blocked or overlapped by the TFT 230 may be smaller than a thickness of the gate insulating layer 206 in a region of the base substrate 202 which is blocked or overlapped by the TFT 230.

In an exemplary embodiment of a method of manufacturing the display substrate 900, the TFT 230 is formed directly on the base substrate 202, the passivation layer 240 is formed directly on the TFT 230, and the light blocking portion 250 is formed directly on the passivation layer 240 which is on the TFT 230, as illustrated in FIGS. 3A to 3D.

The passivation layer 240 and the gate insulating layer 206 are etched using the light blocking portion 250 as the mask. The passivation layer 240 in the region of the base substrate 202 which is not blocked or overlapped by the TFT 230 is etched to be completely removed. The gate insulating layer 206 is etched so that the thickness of the gate insulating layer 206 in the region of the base substrate 202 which is not blocked or overlapped by the TFT 230 is smaller than the thickness of the gate insulating layer 206 in the region of the base substrate 202 which is blocked or overlapped by the TFT 230.

The color filter 260 is formed directly on the TFT 230 which is on the base substrate 202, the light blocking portion 250, and the gate insulating layer 206 which remains in the region of the base substrate 202 which is not blocked or overlapped by the TFT 230.

The capping layer 270 may be formed directly on the color filter 260.

The contact hole 282 is formed to extend completely through thicknesses of the passivation layer 240, the light blocking portion 250, the color filter 260 and the capping layer 270, and the pixel electrode 280 is formed directly on the capping layer 270. The pixel electrode 280 is electrically connected to the drain electrode 214 of the TFT 230 through the contact hole 282.

The alignment layer 290 is formed directly on the pixel electrode 280, to essentially complete the display substrate 900.

According to the exemplary embodiment, the passivation layer 240 and the gate insulating layer 206 are etched using the light blocking layer 250 as the mask, and thus the thickness of the gate insulating layer 206 in the region of the base substrate 202 which is not blocked or overlapped by the TFT 230, may be controlled. Since a thickness of the gate insulating layer 206 may be controlled, a thin portion of a gate insulating layer 206 may be disposed between the base substrate 202 and the color filter 260, such that a reflection of light at an interface between the base substrate 202 and the color filter 260 may be minimized.

According to one or more embodiments of the display substrate, the method of manufacturing the display substrate and the display apparatus having the display substrate, a base substrate and a color filter of which refractive indexes are the same contact each other in a region of the base substrate which is not blocked or overlapped by a TFT, and thus a reflection of light at an interface between the base substrate and the color filter may be decreased. Thus, a transmittance rate of the display apparatus may be increased and a quality of an image displayed on the display apparatus may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
    a base substrate;
    a thin-film transistor on the base substrate;
    a color filter on the thin-film transistor and in contact with the base substrate;
    a pixel electrode on the color filter and in electrical connection with a drain electrode of the thin-film transistor; and
    a light blocking portion between the thin-film transistor and the color filter, the light blocking portion overlapping the thin-film transistor,
    wherein
    the thin-film transistor comprises a gate electrode which is extended from a gate line, and a gate insulting layer on the gate electrode, and
    a length of the gate insulating layer is substantially the same as a length of the light blocking portion in a first direction in which the gate line is extended.

2. The display substrate of claim 1, wherein the color filter is in contact with the base substrate in a region of the base substrate which excludes the light blocking portion.

3. The display substrate of claim 1, further comprising:
    a passivation layer between the thin-film transistor and the light blocking portion, wherein the passivation layer overlaps the thin-film transistor, and
    wherein a length of the passivation layer is substantially the same as a length of the light blocking portion in a first direction in which a gate line extends.

4. The display substrate of claim 1, further comprising:
a contact hole which extends through thicknesses of the color filter and the light blocking portion,
wherein the pixel electrode and the drain electrode of the thin-film transistor are electrically connected to each other through the contact hole.

5. The display substrate of claim 4, further comprising:
a column spacer on the contact hole.

6. The display substrate of claim 5, wherein the column spacer has an achromatic color.

7. The display substrate of claim 1, further comprising:
a capping layer which overlaps the color filter, wherein the capping layer protects the color filter.

8. The display substrate of claim 1, wherein a refractive index of the base substrate and a refractive index of the color filter are substantially the same.

9. A method of manufacturing a display substrate, the method comprising:
forming a thin-film transistor on a base substrate, the thin film transistor comprising a gate electrode which is extended from a gate line;
forming a gate insulating layer on the gate electrode;
forming a color filter on thin-film transistor formed on the base substrate, wherein the color filter contacts the base substrate;
forming a light blocking portion which overlaps the thin-film transistor;
etching the gate insulating layer using the light blocking portion as a mask such that a length of the gate insulating layer is substantially the same as a length of the light blocking portion in a first direction in which the gate line is extended; and
forming a pixel electrode on the color filter, wherein the pixel electrode is electrically connected to a drain electrode of the thin-film transistor.

10. The method of claim 9, further comprising:
forming a passivation layer between the thin-film transistor and the light blocking portion, wherein the passivation layer overlaps the thin-film transistor.

11. The method of claim 10, further comprising:
etching the passivation layer using the light blocking portion as a mask.

12. The method of claim 9, further comprising:
forming a contact hole through the color filter and the light blocking portion, wherein the pixel electrode is electrically connected to the drain electrode of the thin-film transistor through the contact hole.

13. The method of claim 12, further comprising:
forming a column spacer on the contact hole.

14. The method of claim 9, further comprising:
forming a capping layer on the color filter, wherein the capping layer overlaps the color filter and protects the color filter.

15. A display apparatus comprising:
a display substrate including:
a first base substrate,
a thin-film transistor on the first base substrate,
a color filter on the thin-film transistor, wherein the color filter contacts the first base substrate,
a light blocking portion between the thin-film transistor and the color filter,
wherein the light blocking portion overlaps the thin-film transistor; and
a pixel electrode on the color filter and in electrical connection to a drain electrode of the thin-film transistor,
wherein
the thin-film transistor comprises a gate electrode which is extended from a gate line, and a gate insulting layer on the gate electrode, and
a length of the gate insulating layer is substantially the same as a length of the light blocking portion in a first direction in which the gate line is extended;
an opposite substrate including a second base substrate which faces the first base substrate, and a common electrode on the second base substrate; and
a liquid crystal layer between the display substrate and the opposite substrate.

* * * * *